CLAMPED INTEGRATING CIRCUIT ARRANGEMENTS

Filed Oct. 7, 1963

INVENTORS
John Barnet Macdonald
and
David Horace Chandler
BY Baldwin & Wight
ATTORNEYS 3,221,186
Patented Nov. 30, 1965

3,221,186

CLAMPED INTEGRATING CIRCUIT ARRANGEMENTS

John Burnet Macdonald, Chelmsford, Essex, and David Horace Chandler, Danbury, Essex, England, assignors to The Marconi Company Limited, London, England, a British company Filed Oct. 7, 1963, Ser. No. 314,449
Claims priority, application Great Britain, Oct. 16, 1962, 39,051/62
5 Claims. (Cl. 307—88.5)

This invention relates to clamped integrating circuit arrangements and more specifically to clamped integrating circuit arrangements of the kind wherein a condenser which is in series with a resistance has a D.C. amplifier connected across it and wherein clamping is effected by applying a clamping waveform to a transistor connected in a circuit in shunt with the same condenser.

Figure 1:
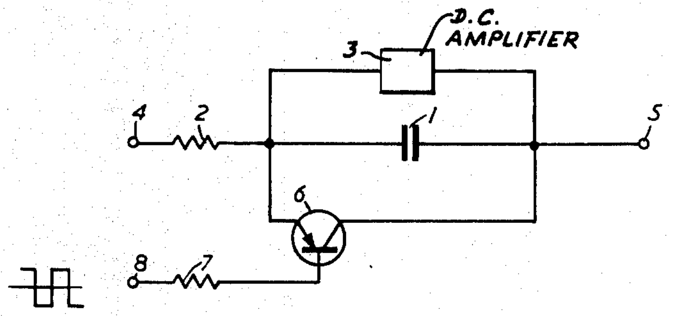
FIG. 1 PRIOR ART
Figure 2:
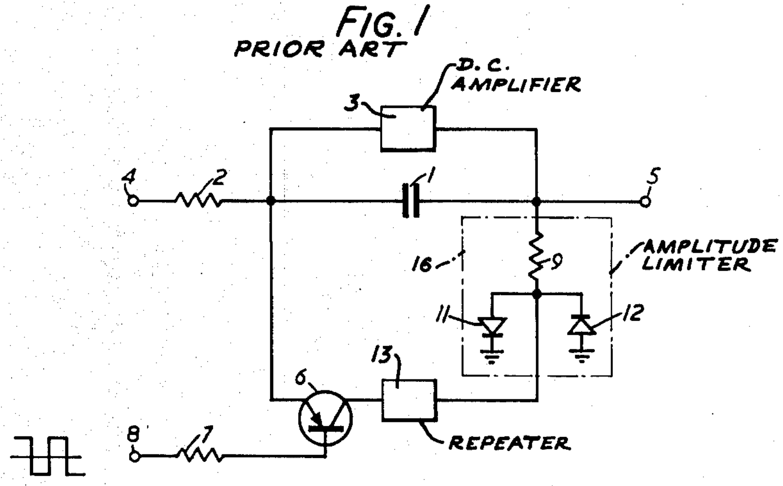
Figure 3:
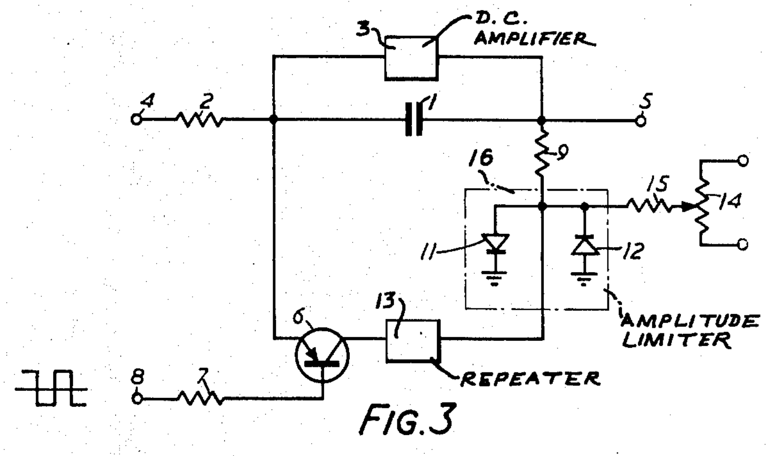

The invention is illustrated in and explained in connection with the accompanying drawings in which FIG. 1 shows a known clamped integrating circuit arrangement of the kind to which the invention relates and FIGS. 2 and 3 show two embodiments of the present invention. Like references denote like parts in all the figures.

Referring to FIG. 1 this shows a clamped integrating circuit arrangement in which the integrating circuit proper is of a kind which is very well known and in common use. The integrating circuit proper consists of a condenser 1 which is in series with a resistance 2 and across which is connected a high gain D.C. amplifier 3. The input terminal for signals to be integrated is referenced 4, and 5 is the output terminal. In order to provide a known reference point from which integration starts, means are provided for shorting out or clamping the condenser 1 before integration and removing the short or clamp when integration is to start. This clamping is effected by a transistor 6 connected across the condenser 1 and to the base of which is applied, through a resistance 7 from a terminal 8, a suitable rectangular clamping waveform as indicated conventionally adjacent the terminal 8. The transistor 6 may be either of the PNP or of the NPN type (a PNP type is indicated) and during clamping the said transistor is rendered conductive by either the negative or positive half of the clamping waveform, depending on the type of transistor employed. In this condition the transistor draws base current. During integration periods the voltage between the base and the emitter of the transistor must be such that the effective diode constituted by the emitter and the base is non-conductive and also the relation between the base voltage and the peak output voltage at terminal 5 must be such that the effective diode constituted by the collector and the base of the transistor is also held non-conductive. If the maximum positive voltage swing at the output terminal 5 is equal to $+x$ volts, the base voltage on the transistor must be taken, in going from the clamping condition to the integrating condition and vice-versa, to more than $+x$ volts. This requirement leads to a serious undesired limitation in the utility of the arrangement, especially if, as is almost always the case, the transistor 6 is a high speed silicon transistor. Almost invariably a silicon transistor is used because the leakage of commercially available germanium transistors is too high for them to be regarded as satisfactory for use in the arrangement.

Existing available high speed transistors suitable for use at the transistor 6 of FIG. 1 are undesirably limited as respects their permissible reverse base-emitter voltage. To take a practical figure the permissible reverse base-emitter voltage of a high speed silicon transistor as at present commercially available is only about 5 volts. In consequence, if such a transistor is employed for the transistor 6 of FIG. 1 the maximum permissible voltage at the output terminal is only +5 volts. This is a severe and undesirable limitation which it is the object of the present invention to remove.

According to this invention a clamped integrating circuit arrangement comprises a condenser in series with a resistance, a D.C. amplifier connected across said condenser, a shunt circuit including a transistor, an amplitude limiter and a repeater, connected across said condenser, and means for applying a clamping voltage wave form to the base of said transistor to render it conductive to clamp said condenser at pre-determined times.

The repeater is preferably, though not necessarily, of unity gain.

The limiter may conveniently comprise a resistance in series in the aforesaid shunt circuit and two oppositely poled diodes connected between the repeater input terminal and a point of anchored potential.

It required a pre-determined D.C. potential from an external source, which may be adjustable, may be applied at a point in the aforesaid shunt circuit preceding limitation in order to provide a desired "rest level." Thus, where the limiter is as above described the said D.C. potential may be applied through a resistance at the point of connection of the diodes.

Our co-pending application Serial No. 314,430 of October 7, 1963, entitled "Integrating Circuit Arrangements," concerns an invention which consists broadly in providing, for pre-determination of the rest level in an integrating circuit arrangement comprising a condenser in series with a resistance, a D.C. amplifier connected across said condenser, a switchable shunt circuit, of such nature as not to interfere with the normal integrating operation of the arrangement when said switchable shunt circuit is open circuited, also connected across said condenser, and means for applying a pre-determined D.C. potential to a point in the shunt circuit across said condenser. The present application is directed to an invention distinct from the invention claimed in the aforesaid pending application.

FIGURE 2 shows an embodiment of the present invention. It differs from FIG. 1 by the inclusion, in series in the shunt circuit across the condenser 1, of amplitude limiter 16 and a repeater 13. The limiter 16, which consists of the parts within the chain line block, comprises a resistance 9, in the shunt circuit, and two oppositely poled diodes 11 and 12 connecting the repeater end of the resistance 9 to earth. The repeater 13 may be of any suitable known form and may co nveniently be of unity gain.

To quote practical figures, suppose the limiter is set to limit at ±2 volts. The output of the repeater will not then follow the voltage at the output terminal 5 if this voltage swings outside this range. The voltage required on the base of the transistor 6 is now no longer determined by the maximum voltage at the terminal 5 but by the maximum at the output of the limiter, and accordingly the permissible base-emitter junction reverse voltage of the transistor 6 no longer limits the permissible output voltage swing. Thus a high speed silicon transistor with a permissible base-emitter junction reverse voltage of only 5 volts can be satisfactorily used in an arrangement in which the maximum output terminal voltage swing is, say, ±10 volts or more.

An incidental advantage also obtained is that errors in the output originating from the clamping voltage waveform applied at 8 and occurring because of unavoidable emitter-base capacity in the transistor, are reduced in amplitude.

FIG. 3 shows a further modification in which, in order to provide determination or adjustment of the rest voltage, an adjustable D.C. potential is applied in the shunt circuit across the condenser 1. As shown this is derived from a potentiometer 14 connected across a suitable D.C. source (not shown) and is applied through a resistance 15 to the junction point of resistance 9 with input terminal of the repeater 13.

Obviously, in both FIGURES 2 and 3, the emitter and collector connections of transistor 6 could be interchanged.

We claim:

1. A clamped integrating circuit arrangement comprising a condenser in series with a resistance; an output terminal connected to said condenser; a D.C. amplifier connected across said condenser; a short circuit connected across said condenser and including a transistor, an amplitude limiter, and a repeater, said amplitude limiter being connected between said output terminal and said repeater; and means for applying a clamping voltage wave form to the base of said transistor to render it conductive to clamp said condenser at predetermined times.

2. An arrangement as claimed in claim 1 wherein the repeater is of unity gain.

3. An arrangement as claimed in claim 1 wherein the limiter comprises a resistance in series in the aforesaid shunt circuit and two oppositely poled diodes connected between the repeater input terminal and a point of anchored potential.

4. An arrangement as claimed in claim 1, and further comprising means for applying a D.C. potential from an external source at a point in the aforesaid shunt circuit preceding limitation in order to provide a desired "rest level."

5. An arrangement as claimed in claim 4 wherein the said D.C. potential is applied through a resistance at the point of connection of the diodes.

References Cited by the Examiner

UNITED STATES PATENTS 3,129,326 4/1964 Balaban ------------ 235—183

ARTHUR GAUSS, *Primary Examiner.*